(12) United States Patent
Weisz et al.

(10) Patent No.: US 9,583,307 B2
(45) Date of Patent: Feb. 28, 2017

(54) SYSTEM AND METHOD FOR CONTROLLING SPECIMEN OUTGASSING

(71) Applicant: APPLIED MATERIALS ISRAEL LTD., Rehovot (IL)

(72) Inventors: Emil Weisz, Modiin (IL); Mordechai Rozen, Rishon Lezion (IL)

(73) Assignee: Applied Materials Israel Ltd., Rehovot (IL)

( * ) Notice: Subject to any disclaimer, the term of this patent is extended or adjusted under 35 U.S.C. 154(b) by 82 days.

(21) Appl. No.: 14/788,788

(22) Filed: Jul. 1, 2015

(65) Prior Publication Data

US 2017/0004951 A1    Jan. 5, 2017

(51) Int. Cl.
*H01J 37/16* (2006.01)
*H01J 37/18* (2006.01)

(52) U.S. Cl.
CPC ............ *H01J 37/18* (2013.01); *H01J 2237/28* (2013.01)

(58) Field of Classification Search
CPC .................................. H01J 37/18; H01J 37/16
USPC .................. 250/441.11, 492.2, 288, 440.11
See application file for complete search history.

(56) References Cited

U.S. PATENT DOCUMENTS

| | | | | |
|---|---|---|---|---|
| 3,235,476 A | * | 2/1966 | Boyd | C23C 14/0036 204/192.12 |
| 4,020,353 A | * | 4/1977 | Saito | H01J 37/20 250/441.11 |
| 4,066,905 A | * | 1/1978 | Dassler | H01J 37/22 250/310 |
| 4,426,439 A | * | 1/1984 | Kobayashi | G03F 7/20 118/719 |
| 5,412,211 A | * | 5/1995 | Knowles | H01J 37/228 250/310 |
| 6,608,318 B1 | * | 8/2003 | Perkins | H01J 27/02 250/281 |
| 8,348,234 B2 | * | 1/2013 | Duelli | F16K 3/186 251/204 |
| 8,933,422 B2 | * | 1/2015 | Ishii | H01J 37/16 250/492.1 |
| 9,245,710 B2 | * | 1/2016 | Gunji | H01J 37/185 |
| 2003/0037874 A1 | * | 2/2003 | Liau | H01L 21/187 156/306.3 |
| 2011/0031394 A1 | * | 2/2011 | Knowles | H01J 37/301 250/307 |
| 2013/0200271 A1 | * | 8/2013 | Ishii | H01J 37/16 250/441.11 |
| 2015/0060694 A1 | * | 3/2015 | Gunji | H01J 37/185 250/440.11 |

* cited by examiner

*Primary Examiner* — David A Vanore
(74) *Attorney, Agent, or Firm* — Kilpatrick Townsend & Stockton LLP

(57) ABSTRACT

According to an embodiment of the invention there may be provided a system that may include a specimen chamber, an exchange chamber, a pressure monitor; and a controller. The exchange chamber may be configured to (i) receive a specimen when an exchange chamber pressure maintained within the exchange chamber is at a first pressure level, (ii) reduce the exchange chamber pressure to be lower than a specimen vapor pressure. The pressure monitor may be configured to perform, during a measurement period, at least one measurement of the exchange chamber pressure. The exchange chamber may be configured to stop a reduction of the exchange chamber pressure during the measurement period.

14 Claims, 7 Drawing Sheets

SYSTEM AND METHOD FOR CONTROLLING SPECIMEN OUTGASSING

BACKGROUND OF THE INVENTION

Specimens such as but not limited to wafers may be reviewed using a scanning electron microscope. A scanning electron microscope (SEM) must maintain a very low vacuum level within a specimen chamber in order to provide high resolution SEM images.

Wafers can be entered to the specimen chamber of the SEM only after they are dry enough—their outgassing level is below a predefined outgassing level.

Wafers may be positioned within an exchange chamber before entering the specimen chamber of the SEM. After receiving the wafer the exchange chamber is sealed and the exchange chamber starts to constantly evacuate gas within the exchange chamber—until the exchange chamber pressure reaches a low enough level.

An exchange chamber pressure monitor is used for preforming exchange chamber pressure measurements in order to evaluate the outgassing of the wafer within the exchange chamber.

The constant evacuation may speed up the provision of the wafer to the SEM but introduces noise and otherwise deteriorates the accuracy of exchange chamber pressure measurements.

There is a growing need to provide a system and method for accurately estimating the outgassing of a specimen (such as a wafer) within an exchange chamber.

BRIEF SUMMARY OF THE INVENTION

According to an embodiment of the invention there may be provided a system that may include a specimen chamber, an exchange chamber, a pressure monitor; and a controller. The exchange chamber may be configured to (i) receive a specimen when an exchange chamber pressure maintained within the exchange chamber is at a first pressure level, (ii) reduce the exchange chamber pressure to be lower than a specimen vapor pressure. The pressure monitor may be configured to perform, during a measurement period, at least one measurement of the exchange chamber pressure. The exchange chamber may be configured to stop a reduction of the exchange chamber pressure during the measurement period.

The controller may be configured to evaluate an outgassing level of the specimen in response to the at least one measurement.

The controller may be configured to control a provision of the specimen to the specimen chamber after the outgassing level of the specimen is below an outgassing threshold.

The controller may be configured to estimate a length of a wait period required for the outgassing level of the specimen to reach below an outgassing threshold.

The controller may be configured to compare the at least one measurement to at least one reference measurement of the exchange chamber pressure; wherein the at least one reference measurement of the exchange chamber pressure is obtained during a reference measurement period; and wherein during the reference measurement period the exchange chamber does not store the specimen and the reduction of the exchange chamber pressure is stopped.

The exchange chamber may be set to a first temperature during the measurement period; and the controller may be configured to compare the at least one measurement to at least one reference measurement of the exchange chamber pressure that is obtained when the exchange chamber is set to a second temperature that differs from the first temperature.

The controller may be configured to calculate a time period required to the exchange chamber pressure to undergo a predefined pressure change.

The controller may be configured to calculate a change in the level of the exchange chamber pressure obtained during a predefined time period.

The exchange chamber may be configured to perform multiple measurements of the exchange chamber pressure during multiple measurement periods that are spaced apart from each other; wherein during each of the multiple measurement periods the reduction of the exchange chamber pressure is stopped; and wherein the exchange chamber may be configured to reduce the exchange chamber pressure during at least one time period between the multiple measurement periods.

The controller may be configured to perform a comparison between measurements of the exchange chamber pressure that were obtained during different measurement periods.

The controller may be configured to determine a distribution of outgassing elements based upon the comparison between the measurements of the exchange chamber pressure that were obtained during the different measurement periods.

The pressure monitor may be configured to perform multiple measurements of partial pressures contributed to different outgassing materials during the measurement period.

The controller may be configured to estimate a gas leakage from the exchange chamber in response a steady state behavior of the exchange chamber pressure.

According to an embodiment of the invention there may be provided a method that may include receiving by an exchange chamber a specimen when an exchange chamber pressure maintained within the exchange chamber is at a first pressure level; reducing, by the exchange chamber, the exchange chamber pressure to a second level that is lower than a specimen vapor pressure; stopping, by the exchange chamber, the reducing of the exchange chamber pressure during a measurement period; and performing, by a pressure monitor and during the measurement period, at least one measurement of the exchange chamber pressure.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
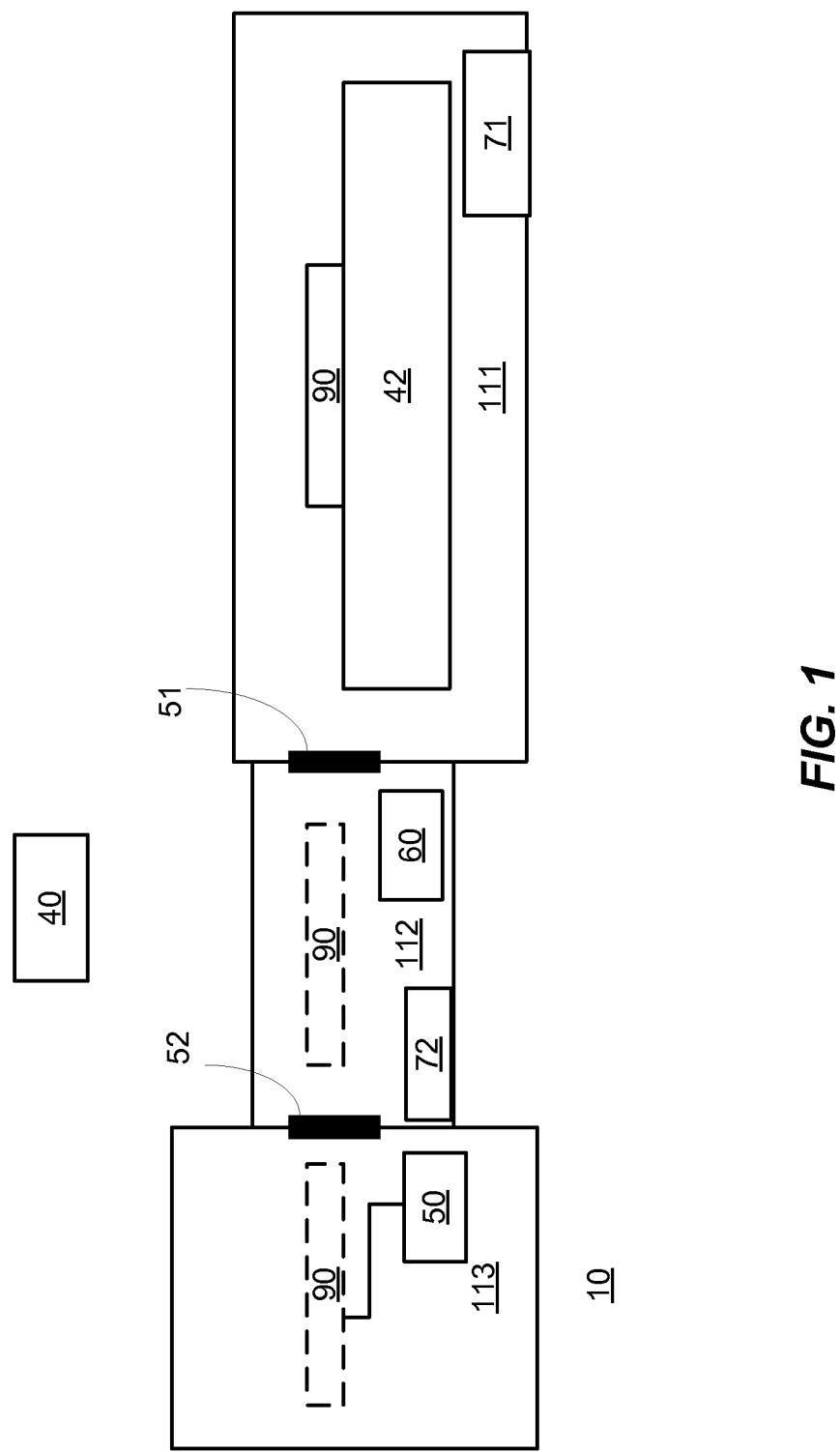
FIG. 1 illustrates a system and a specimen according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

FIG. 1 illustrates system 10 and specimen 90 according to an embodiment of the invention.

System 10 includes specimen chamber 111, exchange chamber 112, pressure monitor 60, controller 40, front end 113, robot 50, movable stage 42, exchange chamber pumping unit 72 and specimen chamber pumping unit 71.

Controller 40 is configured to control the operation of the system 10.

Front end 113 is configured to receive specimen 90. Front end 113 may maintain an atmospheric pressure level and may receive specimen 90 from a specimen holder such as a specimen cassette. Front end 113 may maintain pressure levels that are higher than the specimen chamber pressure levels.

Robot 50 may move specimen 90 through first sealing element 52 (when opened) and between front end 113 and exchange chamber 112.

Pressure monitor 60 is configured to measure the exchange chamber pressure that is maintained within exchange chamber 112.

Exchange chamber 112 includes exchange chamber pumping unit 72. Exchange chamber pumping unit 72 is configured to change the exchange chamber pressure. When the substrate is to me moved to the specimen chamber the exchange chamber pressure may be reduced thereby comparing the exchange chamber pressure to a predefined vacuum level required for proper operation of the SEM.

Specimen chamber 111 includes movable stage 42 for supporting and moving specimen 90 and also includes specimen chamber pumping unit 71. Specimen chamber pumping unit 71 is configured to reduce the specimen chamber pressure.

Specimen 90, when positioned within specimen chamber 111, may undergo at least one process out of an inspection process, a review process, a manufacturing process (such as but not limited to an etching process, a machining process, a deposition process, and the like).

It is assumed that specimen chamber 111 should maintain a predefined vacuum level—that the specimen chamber pressure level should be lower than an atmosphere.

According to an embodiment of the invention, exchange chamber 112 is configured to (i) receive specimen 90 when the exchange chamber pressure is at a first pressure level, (ii) reduce, using exchange chamber pumping unit 72, the exchange chamber pressure to be lower than a specimen vapor pressure.

Pressure monitor 60 is configured to perform, during a measurement period, at least one measurement of the exchange chamber pressure.

During the measurement period, exchange chamber pumping unit 72 does not evacuate gas from exchange chamber 112.

Controller 40 may receive the at least one measurement and determine how to respond to the at least one measurement.

Figure 3:
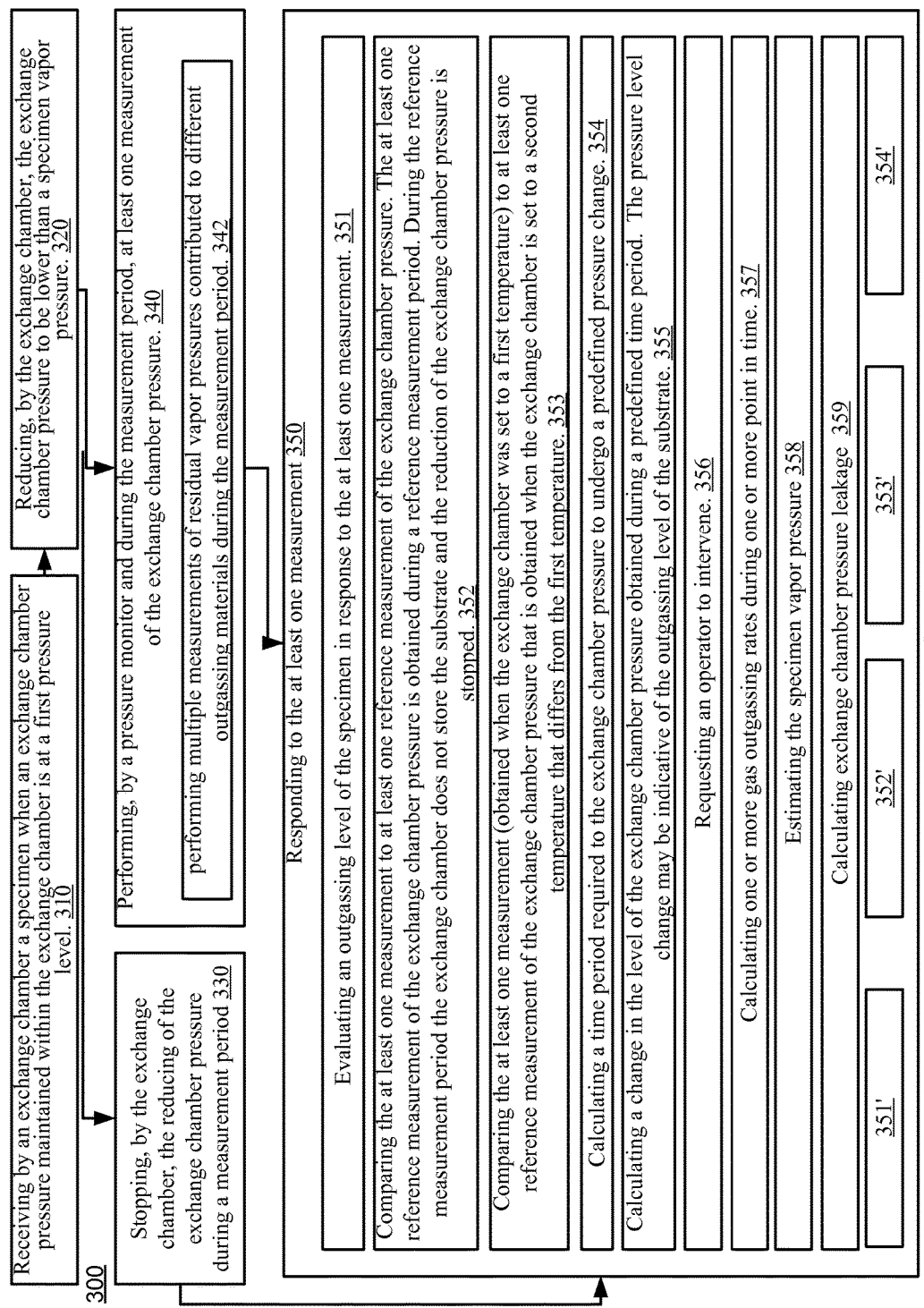
FIG. 3 illustrates a method according to an embodiment of the invention.
Figure 4:
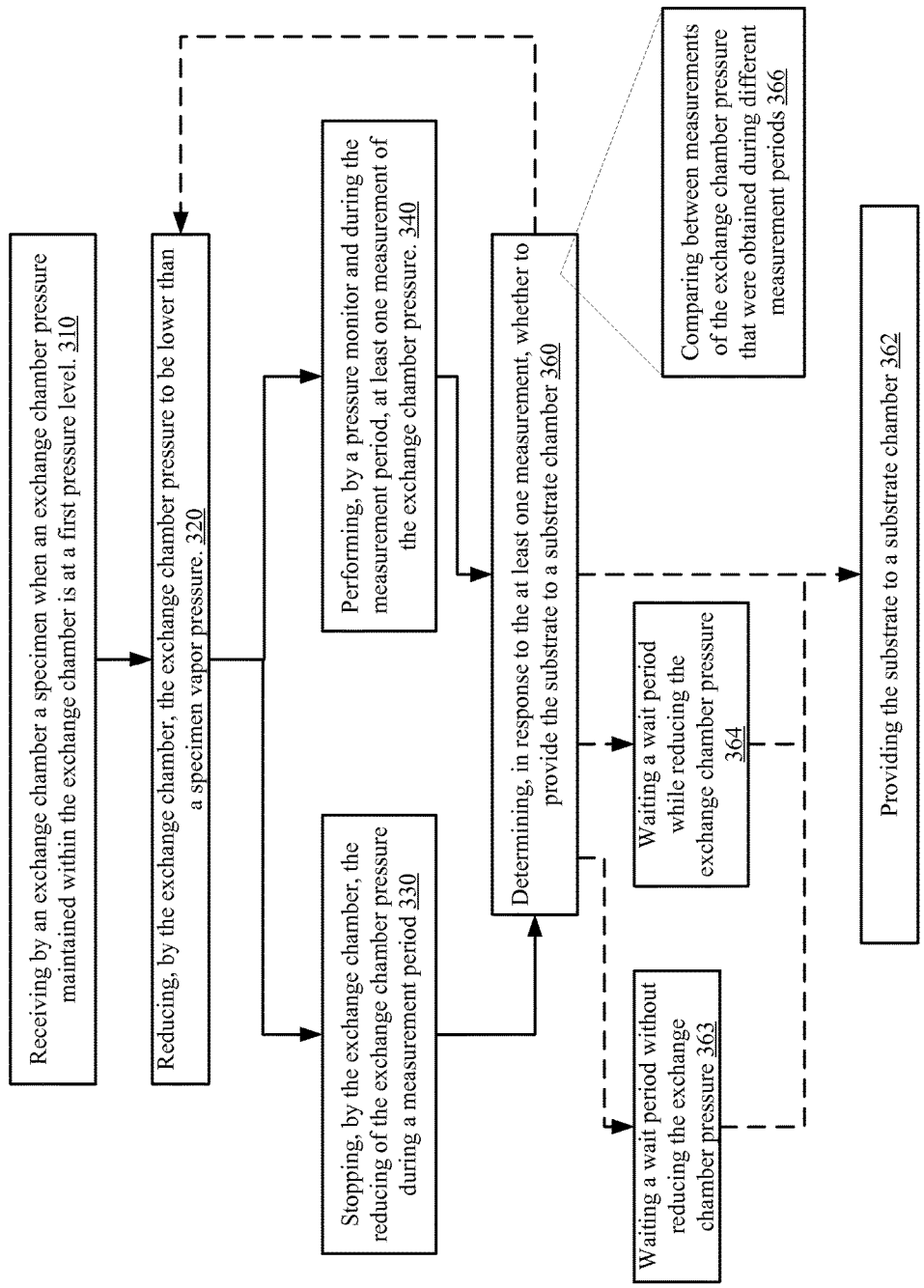
FIG. 4 illustrates a method according to an embodiment of the invention.
Figure 5:
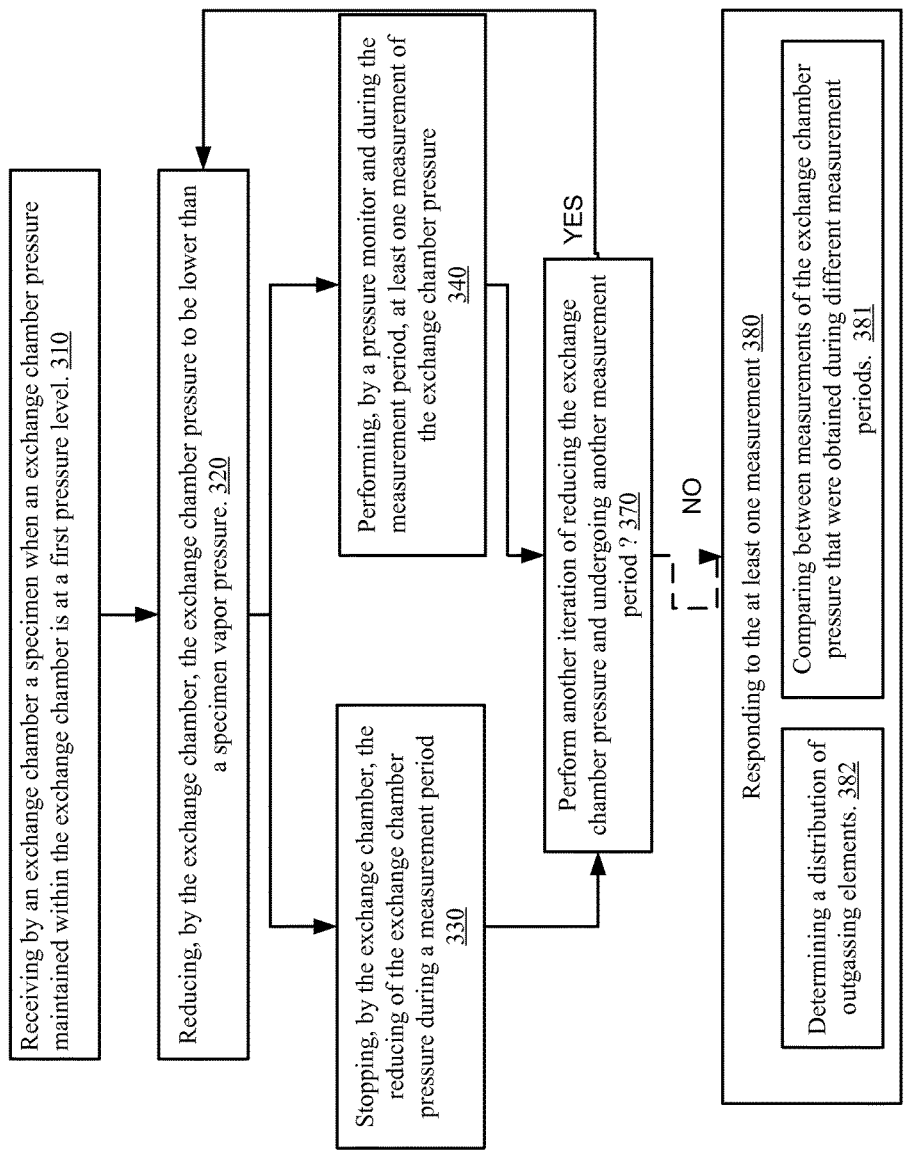
FIG. 5 illustrates a method according to an embodiment of the invention.

System 10 may be configured to execute any method of methods 300, 301 and 302 of FIGS. 3-5.

Figure 2:
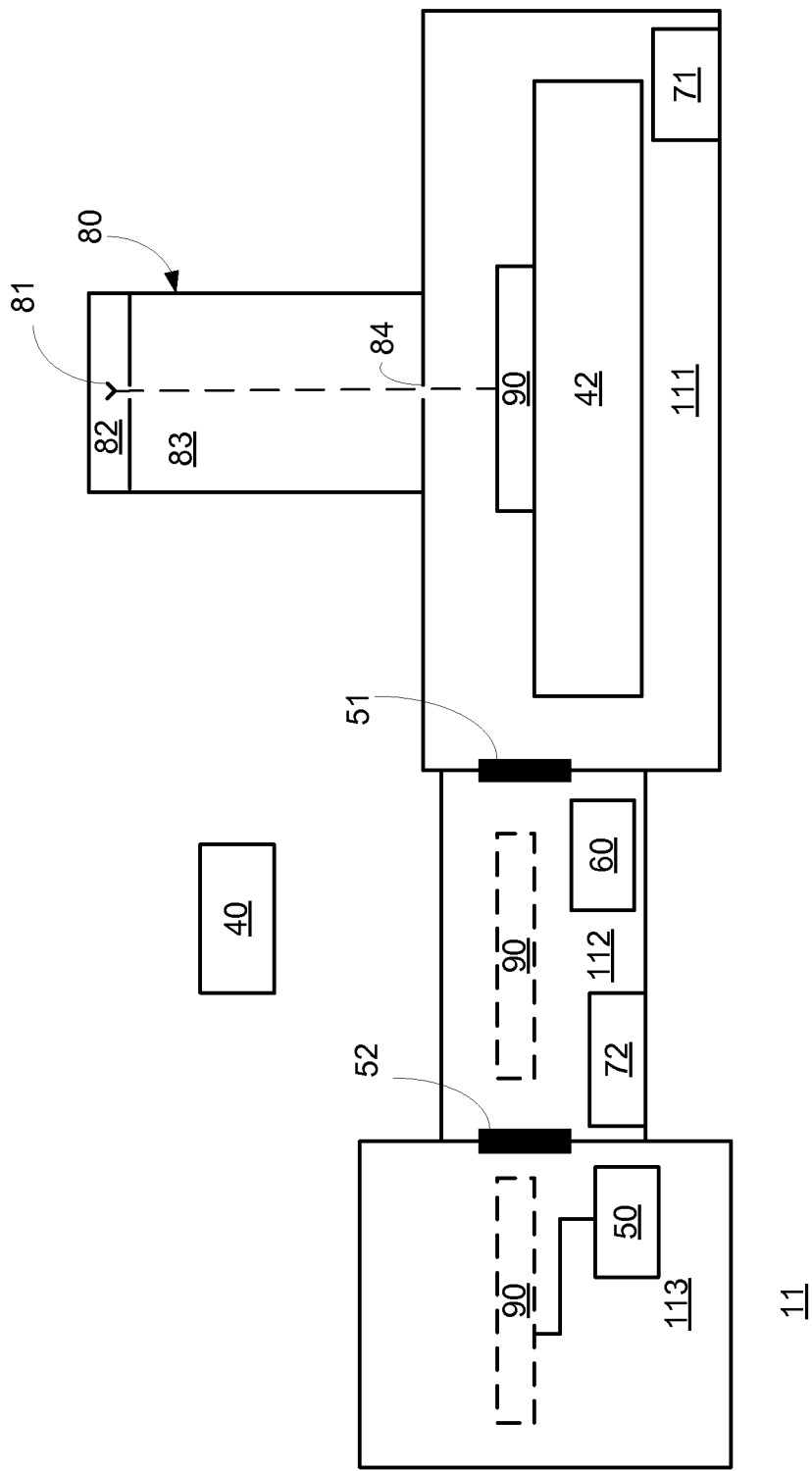
FIG. 2 illustrates a system and a specimen according to an embodiment of the invention.

FIG. 2 illustrates system 11 and specimen 90 according to an embodiment of the invention.

System 11 includes specimen chamber 111, exchange chamber 112, pressure monitor 60, controller 40, front end 113, robot 50, movable stage 42, exchange chamber pumping unit 72, specimen chamber pumping unit 71 and charged beam column 80.

Charged beam column 80 includes a charged beam source 81 that is positioned within a first compartment 82 and electron optics (not shown) positioned within second compartment 83. Charged particle beam 84 is generated by charged beam source 81 and propagates through first compartment 82, second compartment 83 and an aperture formed within specimen chamber 111 to impinge onto specimen 90.

System 11 may be configured to execute any method of methods 300, 301 and 302 of FIGS. 3-5.

FIG. 3 illustrates method 300 according to an embodiment of the invention.

Method 300 may start by step 310 of receiving, by an exchange chamber, a specimen when an exchange chamber pressure maintained within the exchange chamber is at a first pressure level. The first pressure level is above the pressure level within the specimen chamber. The first pressure level may be above a predefined pressure level required for a proper operation of the specimen chamber.

Step 310 may be followed by step 320 of reducing, by the exchange chamber, the exchange chamber pressure to a second level that is lower than a specimen vapor pressure. A specimen vapor pressure is a pressure of vapors that exit the specimen.

Step 320 usually includes pumping gas from the exchange chamber.

Step 320 may be followed by steps 330 and 340.

Step 330 may include stopping, by the exchange chamber, the reducing of the exchange chamber pressure during a measurement period. Step 340 may include stopping the pumping of gas from the exchange chamber.

Step 340 may include performing, by a pressure monitor and during the measurement period, at least one measurement of the exchange chamber pressure.

Step 340 may include step 342 of performing multiple measurements of partial pressures contributed to different outgassing materials during the measurement period. Step 342 may be executed by a pressure monitor that is a residual gas analyzer.

Steps 330 and 340 may be followed by step 350 of responding to the at least one measurement taken during the measurement period.

Step 350 may include processing the at least one measurements and determining a response in view of the outcome of the processing.

Step 350 may include determining to provide the specimen to the specimen chamber, determining to delay the provision of the specimen to the specimen chamber, determining to execute one or more additional measurements during one or more additional measurement periods.

Step 350 may include step 351 of evaluating an outgassing level of the specimen in response to the at least one measurement.

Step 350 may include step 352 of comparing the at least one measurement to at least one reference measurement of the exchange chamber pressure. The at least one reference measurement of the exchange chamber pressure is obtained during a reference measurement period. During the reference measurement period the exchange chamber does not store the specimen and the reduction of the exchange chamber pressure is stopped.

The at least one reference measurement is indicative of an exchange chamber pressure leakage while the at least one measurement taken during step 320 is responsive to both the exchange chamber pressure leakage and the outgassing of the specimen. The comparison executed by step 352 may extract the contribution of the outgassing of the specimen.

Step 340 may be executed when the exchange chamber is set to a first temperature. The exchange chamber can be set to a first temperature by heating or cooling the exchange chamber. Additionally or alternatively, the exchange chamber can be set to a first temperature by heating or cooling the specimen.

Step 350 may include step 353 of comparing the at least one measurement to at least one reference measurement of the exchange chamber pressure that is obtained when the exchange chamber is set to a second temperature that differs from the first temperature.

The exchange chamber pressure leakage is less sensitive to temperature changes than the outgassing from the specimen. The comparison executed by step 353 may extract the contribution of the outgassing of the specimen.

Step 350 may include step 354 of calculating a time period required to the exchange chamber pressure to undergo a predefined pressure change. The time period may be indicative of the outgassing level of the specimen.

Step 350 may include step 355 of calculating a change in the level of the exchange chamber pressure obtained during a predefined time period. The pressure level change may be indicative of the outgassing level of the specimen.

Step 350 may include step 356 of requesting an operator to intervene or declaring that the specimen is faulty. Step 356 may occur when, for example, the outgassing level of the specimen is too high.

Additionally or alternatively, step 356 may include generating an alert, transmitting an alert to another system or device.

Step 350 may include step 357 of calculating one or more gas outgassing rates during one or more point in time. Step 357 may include calculating one or more derivatives of the exchange chamber pressure.

Step 350 may include step 358 of estimating the specimen vapor pressure

Step 350 may include step 359 of calculating exchange chamber pressure leakage. The exchange chamber pressure leakage can be learnt, for example, from the steady state behavior of the exchange chamber pressure. A steady state may be achieved after the specimen finished to outgas or reaches an insignificant level of outgassing.

Step 350 may include step 351' of ejecting the specimen from system 10.

Step 350 may include step 352' of speeding the outgassing by heating the exchange chamber.

Step 350 may include step 353' of determining the provide the specimen to the specimen chamber even when the specimen is still outgassing.

Step 350 may include step 354' of choosing or adjusting work-point/recipe according to the outgassing of the specimen.

FIG. 4 illustrates method 301 according to an embodiment of the invention.

Method 301 starts by step 310. Step 310 is followed by step 320. Step 320 may be followed by steps 330 and 340.

Steps 330 and 340 may be followed by step 360 of determining, in response to the at least one measurement, whether to provide the specimen to a specimen chamber.

The specimen may be provided to the specimen chamber when the specimen is dry enough—when the outgassing level of the specimen is below an outgassing threshold.

Step 360 may include determining that the specimen is dry enough. If the specimen is dry enough then step 360 is followed by step 362.

If the specimen is not dry enough then step 360 may be followed by either one of steps 363, 364 and 320.

The selection between steps 363, 364 and 320 may be responsive to the exchange chamber pressure, an outgassing level of the specimen and to a need to perform additional measurements.

Step 360 may include determining, if the specimen is not dry enough, that the provision of the specimen to the specimen chamber should be further delayed by a wait period. Step 360 may include determining the duration of the wait period. Step 360 may include determining if during the wait period the specimen chamber pressure should be reduced or not.

Step 360 may include determining, if the specimen is not dry enough, that another iteration of steps 320, 330 and 340 is required. When another iteration of steps 330 and 340 is required then step 360 is followed by step 320.

The execution of multiple iterations of steps 330, 340 and 360 results in obtaining multiple measurements of the exchange chamber pressure during multiple measurement periods that are spaced apart from each other. During each of the multiple measurement periods the reduction of the exchange chamber pressure is stopped. The exchange chamber pressure is reduced during at least one time period between the multiple measurement periods. Step 360 may include step 366 of comparing between measurements of the exchange chamber pressure that were obtained during different measurement periods.

According to the determination made during step 360, step 360 may be followed by at least one of steps 362, 363, 364 and 320. Step 362 may include providing the specimen to a specimen chamber. Step 363 may include waiting a wait period without reducing the exchange chamber pressure. Step 364 may include waiting a wait period while reducing the exchange chamber pressure. Steps 363 and 364 may also be followed by step 320.

FIG. 5 illustrates method 302 according to an embodiment of the invention.

Method 302 may start by step 310.

Step 310 may be followed by step 320.

Step 320 may be followed by steps 330 and 340.

Steps 330 and 340 may be followed by step 370 of determining whether to perform another iteration of reducing the exchange chamber pressure and undergoing another measurement period.

The number of iterations may be set in advance and step 370 may include determining whether the predetermined number of iterations was reached.

If determining to perform another iteration then step 370 is followed by step 320. If determining not to perform another iteration then step 370 may be followed by step 380 of responding to the multiple measurements taken during the multiple measurement periods.

Executing multiple iterations results in obtaining multiple measurements of the exchange chamber pressure during multiple measurement periods that are spaced apart from each other. During each of the multiple measurement periods the reduction of the exchange chamber pressure is stopped. The exchange chamber pressure is reduced during at least one time period between the multiple measurement periods.

Step 380 may include step 381 of comparing between measurements of the exchange chamber pressure that were obtained during different measurement periods.

Step 381 may be followed by step 382 of determining a distribution of outgassing elements based upon the comparison between the measurements of the exchange chamber pressure that were obtained during the different measurement periods. Buried outgassing elements may outgas for longer periods than surface level outgassing elements.

According to an embodiment of the invention the outgassing of the specimen can be learnt from monitoring the change in the specimen chamber immediately after opening the valve between exchange chamber and specimen chamber.

Figure 6:
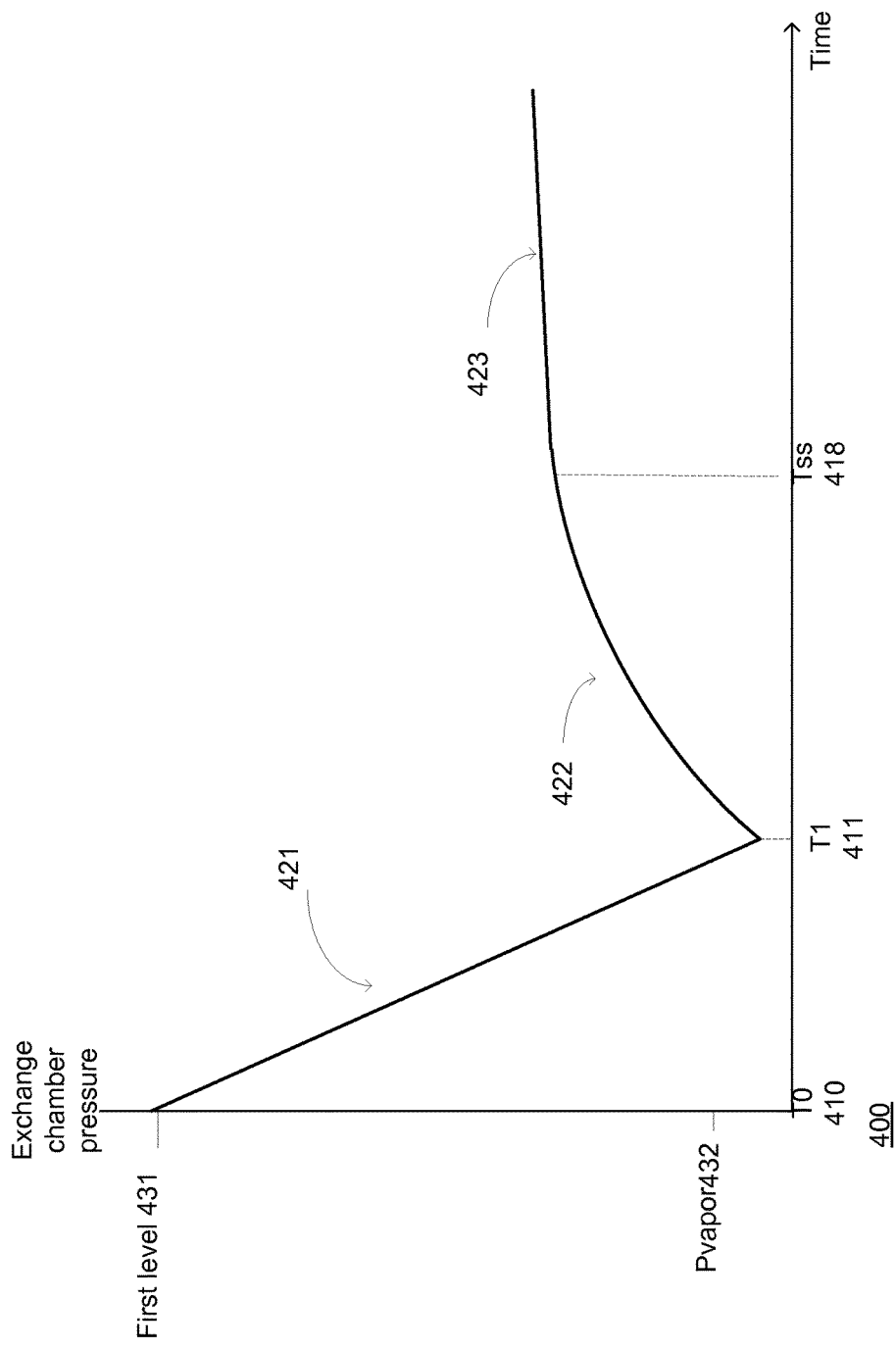
FIG. 6 is a timing diagram according to an embodiment of the invention.

FIG. 6 is a timing diagram 400 according to an embodiment of the invention.

Timing diagram 400 illustrates a single measurement period that is long enough to allow the specimen to stop outgassing and to allow the exchange chamber pressure to change at a constant rate.

Between point of time T0 410 and T1 411 the exchange chamber pressure is reduced (see curve 421)—using exchange chamber pumping unit 72. The exchange chamber pressure level reaches a level below a specimen vapor pressure (Pvapor 432). Pvapor 432 is known in advance or estimated based upon the gas that is expected to be outgassed from specimen.

A measurement period starts at T1 411. At T1 411 the reduction of the exchange chamber stops and the exchange chamber pressure starts to rise.

Between T1 411 and Tss 418 the increment of the exchange chamber pressure (see curve 422) is attributed to specimen outgassing and exchange chamber pressure leakage.

After Tss 418 exchange chamber pressure reaches a steady state (see curve 423) and the increment of the exchange chamber pressure is attributed to exchange chamber pressure leakage alone.

Figure 7:
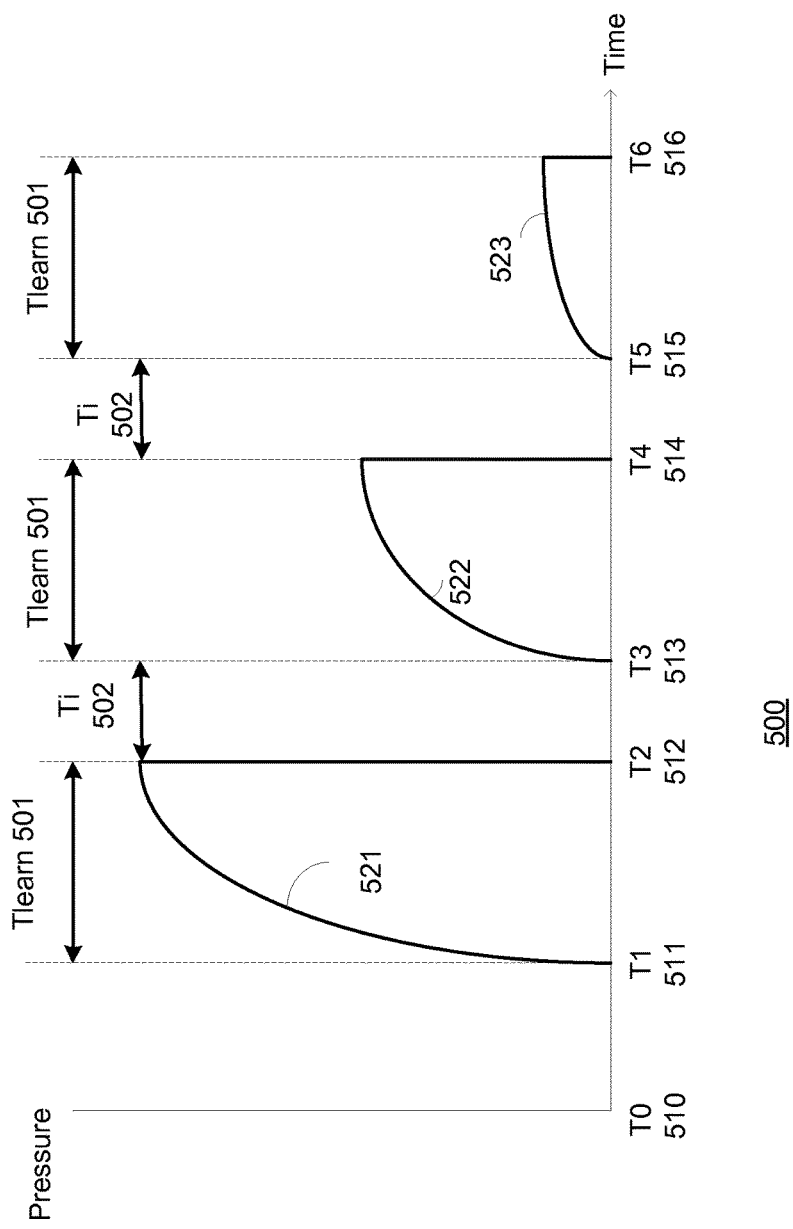
FIG. 7 is a timing diagram according to an embodiment of the invention.

FIG. 7 is a timing diagram 500 according to an embodiment of the invention.

Timing diagram 500 illustrates the exchange chamber pressure during three consecutive and spaced apart measurement periods. The measurement periods are spaced apart from each other by intermediate period Ti 502.

The length of the intermediate period can vary over time. Such a variation can be used to measure contaminant diffusion of buried outgassing elements.

All measurement periods are of length Tlearn 501. The first measurement period starts at T1 511 and ends at T2 512. The second measurement period starts at T3 513 and ends at T4 514. The third measurement period starts at T5 515 and ends at T6 516.

During each measurement period the reduction of exchange chamber pressure is stopped. The reduction of exchange chamber pressure is performed before and after each measurement period—between T0 510 and T1 511, between T2 512 and T3 513, between T4 514 and T5 515 and after T6 516.

When comparing between the exchange chamber pressure changes (illustrated by curves 521, 522 and 523 respectively) of the three learning periods—the outgassing of the specimen decrements over time. The decrement may be indicative of diffusion rates and/or a contaminant (outgassing element) aggregate size.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system comprising:
    a specimen chamber,
    an exchange chamber,
    a pressure monitor; and
    a controller;
    wherein the exchange chamber is configured to (i) receive a specimen when an exchange chamber pressure maintained within the exchange chamber is at a first pressure level, (ii) reduce the exchange chamber pressure to be lower than a specimen vapor pressure;
    wherein the pressure monitor is configured to perform, during a measurement period, at least one measurement of the exchange chamber pressure; and
    wherein the exchange chamber is configured to stop a reduction of the exchange chamber pressure during the measurement period.

2. The system according to claim 1 wherein the controller is configured to evaluate an outgassing level of the specimen in response to the at least one measurement.

3. The system according to claim 2 wherein the controller is configured to control a provision of the specimen to the specimen chamber after the outgassing level of the specimen is below an outgassing threshold.

4. The system according to claim 2 wherein the controller is configured to estimate a length of a wait period required for the outgassing level of the specimen to reach below an outgassing threshold.

5. The system according to claim 1 wherein the controller is configured to compare the at least one measurement to at least one reference measurement of the exchange chamber pressure;

wherein the at least one reference measurement of the exchange chamber pressure is obtained during a reference measurement period; and wherein during the reference measurement period the exchange chamber does not store the specimen and the reduction of the exchange chamber pressure is stopped.

6. The system according to claim 1 wherein exchange chamber is set to a first temperature during the measurement period; and wherein the controller is configured to compare the at least one measurement to at least one reference measurement of the exchange chamber pressure that is obtained when the exchange chamber is set to a second temperature that differs from the first temperature.

7. The system according to claim 1 wherein the controller is configured to calculate a time period required to the exchange chamber pressure to undergo a predefined pressure change.

8. The system according to claim 1 wherein the controller is configured to calculate a change in the level of the exchange chamber pressure obtained during a predefined time period.

9. The system according to claim 1 wherein the exchange chamber is configured to perform multiple measurements of the exchange chamber pressure during multiple measurement periods that are spaced apart from each other; wherein during each of the multiple measurement periods the reduction of the exchange chamber pressure is stopped; and wherein the exchange chamber is configured to reduce the exchange chamber pressure during at least one time period between the multiple measurement periods.

10. The system according to claim 9 wherein the controller is configured to perform a comparison between measurements of the exchange chamber pressure that were obtained during different measurement periods.

11. The system according to claim 10 wherein the controller is configured to determine a distribution of outgassing elements based upon the comparison between the measurements of the exchange chamber pressure that were obtained during the different measurement periods.

12. The system according to claim 1 wherein the pressure monitor is configured to perform multiple measurements of partial pressures contributed to different outgassing materials during the measurement period.

13. The system according to claim 1 wherein the controller is configured to estimate a gas leakage from the exchange chamber in response a steady state behavior of the exchange chamber pressure.

14. A method, comprising: receiving by an exchange chamber a specimen when an exchange chamber pressure maintained within the exchange chamber is at a first pressure level; reducing, by the exchange chamber, the exchange chamber pressure to a second level that is lower than a specimen vapor pressure; stopping, by the exchange chamber, the reducing of the exchange chamber pressure during a measurement period; and performing, by a pressure monitor and during the measurement period, at least one measurement of the exchange chamber pressure.

* * * * *